United States Patent
Pedersen et al.

(10) Patent No.: US 7,307,488 B2
(45) Date of Patent: Dec. 11, 2007

(54) METHOD OF ESTIMATING AN INTERSECTION BETWEEN AT LEAST TWO CONTINUOUS SIGNAL REPRESENTATIONS

(75) Inventors: Kim Rishøj Pedersen, Egå (DK); Lars Arknaes-Pedersen, Viby J (DK)

(73) Assignee: TC Electronic A/S (DK)

( * ) Notice: Subject to any disclaimer, the term of this patent is extended or adjusted under 35 U.S.C. 154(b) by 155 days.

(21) Appl. No.: 10/557,778

(22) PCT Filed: May 21, 2004

(86) PCT No.: PCT/DK2004/000361

§ 371 (c)(1),
(2), (4) Date: Nov. 18, 2005

(87) PCT Pub. No.: WO2004/105233

PCT Pub. Date: Dec. 2, 2004

(65) Prior Publication Data
US 2007/0052464 A1 Mar. 8, 2007

(30) Foreign Application Priority Data
May 21, 2004 (DK) .................... PCT/DK03/00334

(51) Int. Cl.
*H03K 7/08* (2006.01)
(52) U.S. Cl. .................................................. 332/109
(58) Field of Classification Search ........ 332/109–111; 327/172; 375/238
See application file for complete search history.

(56) References Cited

U.S. PATENT DOCUMENTS 6,473,457 B1 * 10/2002 Pascual et al. .............. 375/238
6,606,044 B2 * 8/2003 Roeckner et al. ........... 341/143
2005/0046601 A1 * 3/2005 Alrutz et al. ................. 341/53

FOREIGN PATENT DOCUMENTS

WO    WO 92/11699    9/1992

OTHER PUBLICATIONS

International Search Report; PCT/DK2004/000361; Sep. 8, 2004.
Goldberg J N et al: "New high accuracy pulse width modulation based digital-to-analogue convertor/power amplifier"; IEE Proceedings: Circuits Devices and Systems, Institution of Electrical Engineers, Stenvenage, GB, vol. 141, No. 4, Aug. 1, 1994, pp. 315-324, XP006001521; ISSN: 1350-2409 paragraphs '0002!; figures 1,1,8.

(Continued)

*Primary Examiner*—David Mis
(74) *Attorney, Agent, or Firm*—Cantor Colburn LLP

(57) ABSTRACT

The invention relates to a method of estimating an intersection between at least two continuous signal representations (SR1, SR2) in a pulse width modulator, at least one of said continuous signal representations (SR1, SR2) being non-linear, said method comprising the step of providing an intersection estimate (CPE) between said at least two continuous signal representations on the basis of at least one iteration comprising at least one iterative call of a function describing said continuous signal representations (SR1, SR2) being non-linear and whereby said estimating of intersections are performed in a pulse width modulation modulator. According to an embodiment of the invention, a simple iterative call of the established continuous signal representation, e.g. an interpolation polynomial, will provide the desired intersection. It should be noted that the established estimate might be provided without any complicated root solving and avoiding division and even square root.

43 Claims, 9 Drawing Sheets

OTHER PUBLICATIONS

Sandler M B: "Digital-to-Analogue Conversion Using Pulse Width Modulation"; Electronics and Communication Engineerin; Journal, Institution of Electrical Engineers, London, GB, vol. 5, No. 6, Dec. 1993, pp. 339-348, XP000423792; ISSN: 0954-0695; paragraph '0005!.

Hiorns R E et al: "Power Digital to Analogue Widt Modulation and Digital Signal Processing"; IEE Proceedings G. Electronic Circuits & Systems, Institution of Electrical Engineers. Stevenage, GB, vol. 140, No. 5, Oct. 1, 1993, pp. 329-338, XP000400068 ISSN: 0622-0039 paragraph '03.4!.

* cited by examiner

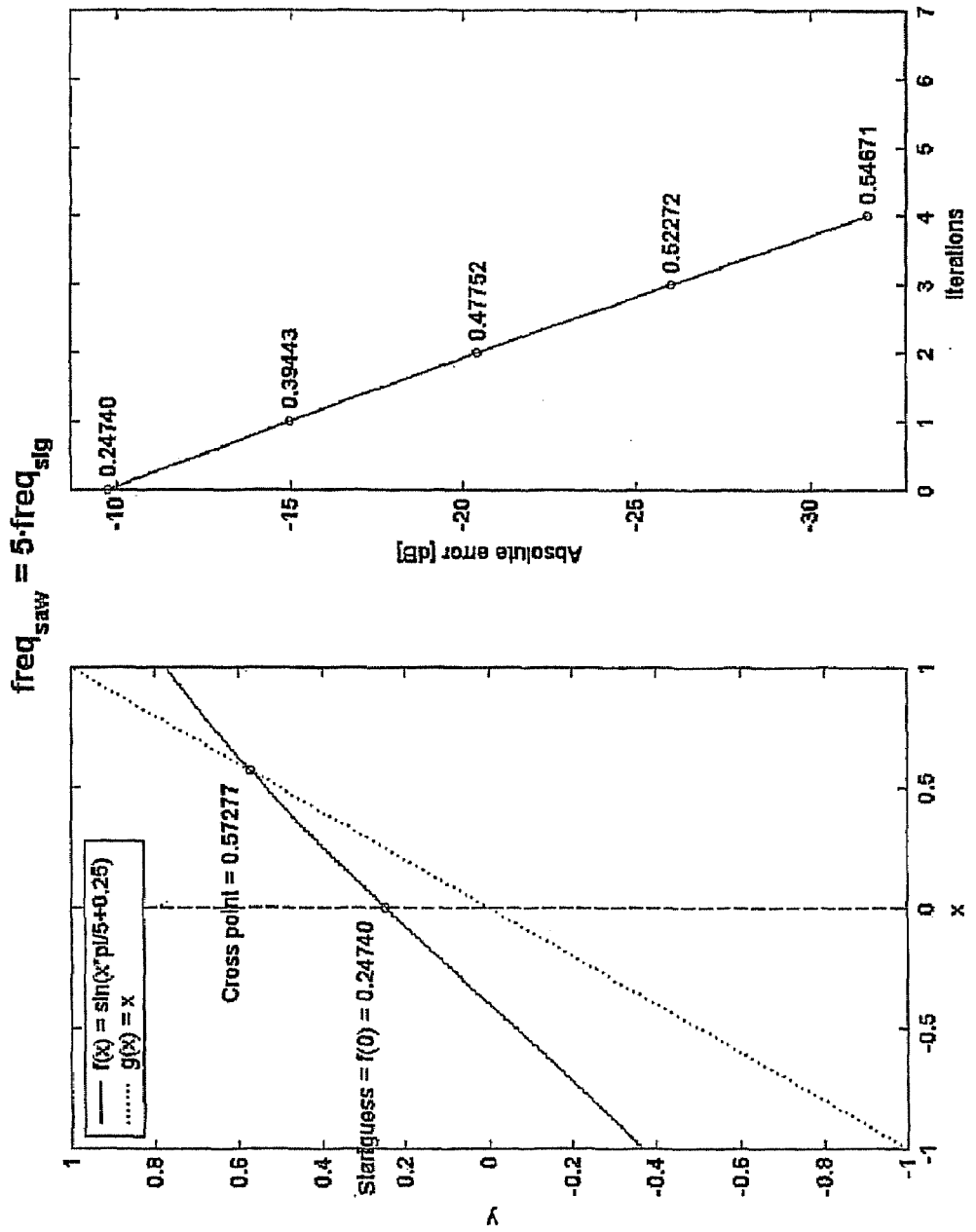

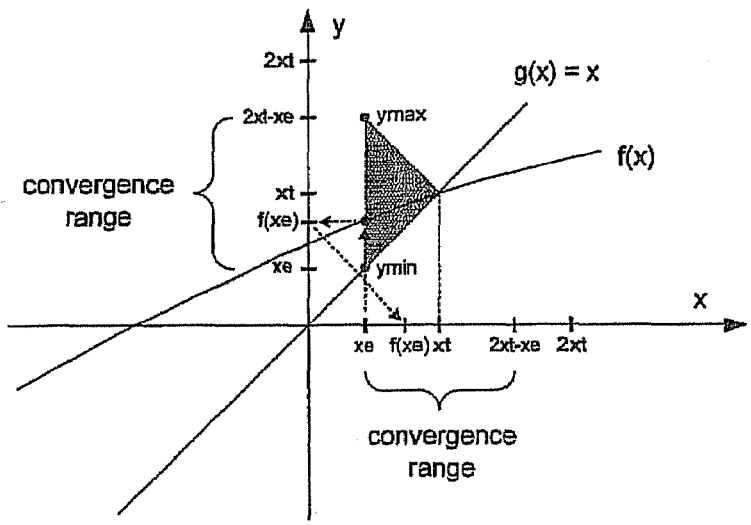
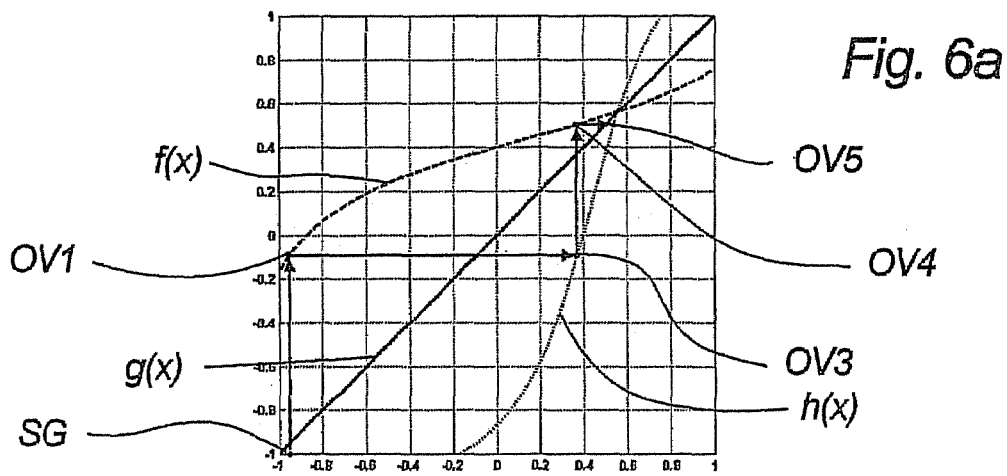
Fig. 6a
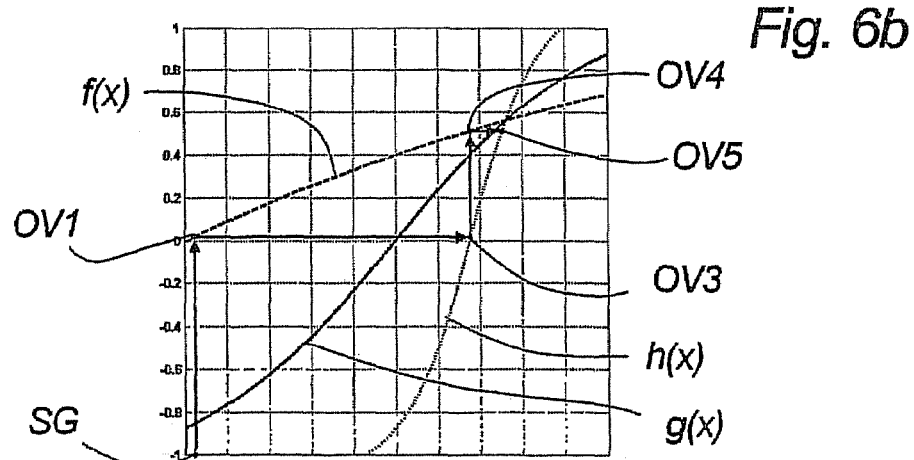
Fig. 6b
Fig. 6c

METHOD OF ESTIMATING AN INTERSECTION BETWEEN AT LEAST TWO CONTINUOUS SIGNAL REPRESENTATIONS

FIELD OF THE INVENTION

The present invention relates to a method of establishing an intersection estimate between two functions.

BACKGROUND OF THE INVENTION

Pulse width modulation, PWM, is used widely within the field of for instance audio amplifiers. Generally, the available pulse width modulation techniques may be categorized into typically three different types of pulse width modulation, natural pulse width modulation, NPWM, uniform pulse width modulation, UPWM or linearized pulse width modulation, hereinafter LPWM.

Generally, all pulse width modulation implies the technique of transforming or converting an input signal into an output square wave signal having a certain pulse width, at least partly defined by the input signal by comparison of the input signal to a reference signal.

A short review of the general understanding of the above-mentioned groups of pulse width modulation techniques will be given below.

Natural pulse width modulation, NPWM, typically implies the comparison of a continuous time signal, typically an analogue waveform signal, to a reference signal, typically a sawtooth signal. The output signals will then switch between typically two output levels when the input signal and the reference signal intersect.

The natural pulse width modulation technique, NPWM, is generally regarded as distortion free within the audio band.

Uniform pulse width modulation, UPWM, typically implies the comparison of a discrete time signal, typically a digital wave form signal such as a PCM signal, to a reference signal, typically a sawtooth signal. The output signals will then switch between typically two output levels when the input signal and the reference signal intersect. A well-known problem related to uniform pulse width modulation, UPWM, is that the input signal, due to its discrete nature, may basically not necessarily be represented at the time of intersection. This problem may be dealt with in different ways, e.g. simply by accepting the error, and simply quantizing the intersection time according to a quantizing algorithm.

In order to counteract the inherent distortion several PWM linearization techniques has been disclosed within the art.

Linearized pulse width modulation, LPWM, typically deals with emulation of the theoretical value of the input signal, if a sample of the input signal was actually present at the time of intersection between the reference signal and the input signal.

Such methods are often referred to as linearized pulse width modulation, LPWM. Prior art demonstrates linear interpolation between two adjacent input samples to achieve the output pulse width. In other words, the linearization algorithms typically operate on more than one sample of the input signal to determine the linearized output pulse width.

Thus several linearization techniques apply to first order interpolation of the input signal between the discrete samples in order to estimate the true cross point between the input signal and the reference signal.

Other techniques implying 2nd order interpolation has been applied for the purpose of coming closer to the "true" cross point, thereby minimizing the resultant distortion.

A problem of many of the relatively new and improved LPWM-techniques is that the resulting improvement is relatively costly with respect to computing requirements. Thus, several linearized pulse width modulation techniques require division.

Typically, prior art LPWM-techniques either do not include an algorithm to determine the pulse width, or they disadvantageously require a division operation to compute the pulse width. Division operations are relatively computationally inefficient in digital signal processing and require many more computation steps than for example addition or multiplication operations. Additional silicon area is therefore required to implement techniques involving division. Generally known implementations do not provide computationally efficient methods to reduce harmonic distortion in pulse width modulated systems.

It is the object of the invention to provide an improved PWM-modulation technique featuring low harmonic distortion and computationally efficiency.

SUMMARY OF THE INVENTION

The invention relates to a method of estimating an intersection between at least two continuous signal representations (SR1, SR2) in a pulse width modulator, at least one of said continuous signal representations (SR1, SR2) being non-linear, said method comprising the step of providing an intersection estimate (CPE) between said at least two continuous signal representations on the basis of at least one iteration comprising at least one iterative call of a function describing said continuous signal representations (SR1, SR2) being non-linear and whereby said estimating of intersections are performed in a pulse width modulator.

In a preferred embodiment of the invention a pulse width modulator is a pulse width amplifier.

Pulse width modulation, PWM, is used widely within the field of for instance audio amplifiers. Generally, the available pulse width modulation techniques may be categorized into typically three different types of pulse width modulation, natural pulse width modulation, NPWM, uniform pulse width modulation, UPWM or linearized pulse width modulation, hereinafter LPWM.

Generally, all pulse width modulation implies the technique of transforming or converting an input signal into an output square wave signal having a certain pulse width, at least partly defined by the input signal by comparison of the input signal to a reference signal.

According to an embodiment of the invention, a simple iterative call of the established continuous signal representation, e.g. an interpolation polynomial, will provide the desired intersection. It should be noted that the established estimate may be provided without any complicated root solving and avoiding division and even square root.

According to the invention, the term intersection refers to a more or less accurate estimate of a true intersection between at least two continuous representations of two corresponding signals. Not only does such intersection typically refer to an estimate, but also the meaning of a true intersection should of course be understood in the light of the fact that a signal value between two discrete signal values is more or less meaningless unless it refers to the originating analogue continuous time signal. In this light, the term intersection should of course be understood quite broadly as the intersection between two signals if they were both represented in the continuous time domain. An intersection is also referred to within the art as a cross point.

It should be noted that a continuous signal representation, evidently, refer to a signal representation being continuous.

According to the invention a signal, e.g. the continuously represented signal, may comprise a physical signal or a model of a physical signal or system.

According to an embodiment of the invention, said estimating of intersections are performed in a pulse width modulation amplifier.

According to a most preferred embodiment of the invention, an intersection is provided for the purpose of obtaining the width of a pulse width modulated signal of a pulse width modulator on the basis of an input signal, which is compared to a reference signal.

According to an embodiment of the invention, whereby said intersections determine a pulse width modulated (PWM) output signal.

It should be noted that the shape of an output pulse width modulated signal according to the invention may vary according to the desired application. Thus, although typical rectangular shaped pulses is preferred to most application, derivations from the strict rectangular shape may occur, e.g. by the use of slightly curved output pulses. Such output pulses may be somewhat difficult to handle but offer advantageous properties with respect to harmonic distortion.

According to an embodiment of the invention, whereby said intersections determine the rising or a falling edge of a pulse width modulated (PWM) output signal.

According to an advantageous embodiment of the invention, the determined intersection may advantageously be applied as determination of an edge of a PWM, and may therefore result in a PWM signal having little or no distortion. In this context it should again be remembered that the reduced distortion is obtained by relatively few computing operations.

According to an advantageous embodiment of the invention, the method of determining the intersections may be applied in an audio PWM converter.

According to an embodiment of the invention, said discrete time domain signal (DTB) comprises an input signal of a pulse width modulator and where the other of said at least two continuous signal representations (SR1, SR2) comprising a reference signal on the basis of which a pulse width modulation of said input signal is established.

According to an embodiment of the invention, said reference signal comprises a periodically function, preferably a sawtooth, a triangular or a curved waveform.

According to an embodiment of the invention, said reference signal comprises a periodical signal and where the absolute value of the gradient is constant in each period.

According to an embodiment of the invention, said at least one iterative call comprises at least one evaluation of the output of said continuous non-linear signal representation when applying an input value. The input value may be chosen in many different ways according to the invention. One preferred method, however, is to establish a start guess according to certain predefined criteria, apply this start guess as the input value of the first iteration and then, subsequently, use the output of the resulting output of the non-linear continuous representation as the input value of the next iteration. A start guess may of course be chosen according to many different more or less practical methods.

According to an embodiment of the invention, said at least one iterative call comprises at least one evaluation of the output of an mirror function of said continuous non-linear signal representation when applying an input value. Thus, the iteration may in this way converge towards the only intersection between the function and the mirror function.

According to an embodiment of the invention said at least one iterative call comprises at least one evaluation of the output of a mirror function of said continuous non-linear signal representation when applying an input value, said mirror function being established by mirroring of said continuous non-linear signal representation function in a symmetry function.

According to an embodiment of the invention, said input value comprises a start guess (SG).

According to a preferred embodiment of the invention, the input of an iteration may advantageously comprise an initial guess. This start guess may preferably comprise a value close to the expected intersection.

The start guess may e.g. comprise the previous value or one of the previous known values of the non-linear signal representation or a previous value of the signal from which the non-linear signal representation originates.

According to an embodiment of the invention, said input value comprises the output value of a previous iteration.

According to a preferred embodiment of the invention, the input of an iteration may preferably comprise the output of the previous iteration. In this way, an iteration converging towards the intersection may be established.

In an embodiment of the invention said at least two continuous signal representations (SR1, SR2) comprises a non-linear representation of an input signal and a periodic reference signal and where said reference signal forms the symmetry function between said non-linear representation of an input signal and said mirror function.

According to a preferred embodiment of the invention, the mirror function of the non-linear representation of an input signal should preferably be symmetrical during each period of and with respect to the periodic reference signal, thus obtaining that a crossing between the non-linear representation and the mirror function of the non-linear representation represents exactly the intersection between the non-linear representation and the symmetry function, i.e. the periodic reference signal.

One way of obtaining such a mirror function is quite straightforward and illustrated in the specification, i.e. applying a sawtooth signal as reference signal and where sawtooth signal has the gradient numerically equals 1. In this way the mirror function may be established as the inverse function of the non-linear signal representation may easily be found by applying the output (=y-value) of a previous iteration step on the non-linear signal representation and applying this as the input (=x-value) of the next iteration on the non-linear signal representation. This switching between the non-linear signal representation and the inverse function may be repeated as long as it is necessary.

According to an embodiment of the invention, said symmetry function is linear. According to an embodiment of the invention, the symmetry function forming the symmetry line between the continuous representation and the applied mirror function may even comprise a curved symmetry line, although a mirror function which is actually the inverse function of the curved continuos representation is preferred.

According to an embodiment of the invention, the gradient of the at least one of said continuous signal representations (SR1, SR2) being non-linear is smaller than the other continuous signal representation.

According to a preferred embodiment of the invention, the gradient of the non-linear signal representation should be smaller than the gradient of the other signal. Thereby, it is ensured that the iteration may actually provide a true estimate.

An example illustrating this fact is when an input signal, or rather the model of this input signal is compared to a reference signal. If the gradient of the reference signal exceeds the gradient of the input signal, only one intersection is obtained in each period of the reference signal.

According to an embodiment of the invention, the gradient of the at least one of said continuous signal representations (SR1, SR2) being non-linear is at least three times smaller, preferably five times smaller than the other continuous signal representation.

When the other continuous signal representation is relatively quick varying compared to the variation of the input signal representation, an intersection estimate may be established by using relatively few iteration steps.

According to an embodiment of the invention, the signal bandwidth of said non-linear signal representation being more than ten (10) times smaller the signal bandwidth of the signal representation with which it is compared.

It should be noted that the iterative call(s) benefit(s) from the fact that the limitations on the bandwidth of the input signal and the curve form of the reference signal ensure that there is only one crossing per period if the reference signal, e.g. a rising sawtooth signal. The signal to which it is compared may in practical applications be the reference signal of a PWM modulator.

General, according to the terms applied according to the invention, bandwidth refer to the 3 dB bandwidth unless otherwise noted.

According to an embodiment of the invention, the signal bandwidth of said non-linear signal representation being more than twenty (20) times smaller the signal bandwidth of the signal representation with which it is compared.

According to an embodiment of the invention, the method may in particular be applied within the audio field.

According to an embodiment of the invention, said iteration comprises a recursive call of said continuous signal representation or a derivative thereof.

When a function calls itself, it may simply be referred to as a recursion. A recursion may according to the context of the invention be regarded as a iterative call of the function, where the output of the function is fed back and utilized as an input (argument) to the function.

The recursive call, or the iteration, may be terminated when certain predefined error margins are complied with. Other termination criteria may simply be a termination upon the performing of a certain number of iterations.

According to an embodiment of the invention, said iterative call initiates an iteration sequence.

According to the invention an iteration sequence may be based on a mathematical function, e.g. a model of a function based on a number of discrete values. The mathematical function, i.e. the model, may be constant during the complete iteration or it may vary over time, e.g. the number of iterations. In other words, some of the iterations may be performed when using one mathematical model, and other iterations may be performed when using another or other mathematical models.

According to an embodiment of the invention, said iteration sequence comprises at least a first iteration group and where said first iteration group is performed on a simplified mathematical model.

According to an embodiment of the invention, the first iteration sequence is performed on the basis of the established mathematical model of the non-linear signal. However, the mathematical model has been simplified when performing the first iteration(s) in order to obtain an initial fast approach to the final result of the complete iteration sequence by means of reduced computational capacity, i.e. few calculations.

According to an embodiment of the invention, said iteration sequence further comprises at least one further iteration group and where said further iteration is performed on a more complex mathematical model.

According to an advantageous embodiment of the invention, the last iteration(s) should be performed with relatively high accuracy. In other words, if the first iterations have been performed on the basis of a simplified mathematical model of the non-linear signal, an increasing of the final resolution may be obtained by applying the more complex model when closing in on the convergence point, i.e. the intersection.

According to a most preferred embodiment of the invention, an iteration sequence may simply comprise a first low-resolution iteration followed by a high-resolution iteration.

An example of such an iteration sequence may e.g. comprise a first iteration, which is performed on the basis of a reduced $2^{nd}$ order polynomial and a second iteration, which is performed by a complete $2^{nd}$ order polynomial.

According to an embodiment of the invention, at least one of said iterative calls is established by means of a polynomial model comprising $2^{nd}$ or higher order components, where at least one of the higher-order components has been omitted.

According to a preferred embodiment of the invention, at least one or some of the performed iterations are performed on reduced polynomial models. These iterations will advantageously comprise the initial or some of the initial iterations of the complete iteration process. According to a very preferred embodiment of the invention, the complete iteration process comprises two iterations on a polynomial model, where the first iteration is performed by means of a reduced polynomial model and the second is performed on a complete polynomial or at least a more detailed polynomial. A reduced polynomial may for instance comprise a $2^{nd}$ order polynomial of a signal, where the $2^{nd}$ order component has been omitted. Surprisingly, this "model-truncation" of the $2^{nd}$ order component reduces the final $3^{rd}$ order distortion combined with reduced computation.

Evidently, such model truncation may also be done when applying $3^{rd}$ or higher order polynomial, and where the higher-order or at least some of the even-order components are omitted in at least one of the iterations (preferably at least one of the first iterations).

According to an embodiment of the invention, said at least one iterative call is established by applying a previous value of said continuous signal representations representing a non-linear signal or a value of the non-linear signal as argument.

According to an embodiment of the invention, the at least one recursive call is initiated by a start guess comprising one of the previous values of the discrete time domain signal or the (or one of the) continuous representations thereof.

According to an embodiment of the invention, the argument of at least one iterative call comprises the output of previous calls of the continuous signal representation of a non-linear signal.

According to an embodiment of the invention, said at least one iteration comprises a predetermined fixed number of iterative recursive calls of the continuous representation.

According to an embodiment of the invention, the recursive calls may be terminated after a fixed number of recursive iterations. In this way, complicated stop-criteria may be avoided, and moreover, the calculated intersection estimate may be obtained within a predictable time limit.

According to an embodiment of the invention, said fixed number of iterations is less than 20 (twenty), preferably less than 10 (ten), even more preferably less than 5 (five).

According to an embodiment of the invention, it has been established that even relatively few iterations may in fact result in a quite satisfactory intersection estimate. Evidently, according to the invention, the degree of satisfaction may highly depend on the application. In certain applications, a quick evaluation, e.g. performed in as little as two iterations may perfectly suffice, whereas other applications requiring higher precision may be performed when applying further iterations.

According to an embodiment of the invention, whereby said at least one of said continuous signal representations (SR1, SR2) being non-linear is represented by at least one mathematical model (MP).

According to the invention, a non-linear signal in general refers to a signal, which is anything but a pure linear function. In general, a linear function is a function defined by an equation of the form $f(x)=y=mx+b$. Thus, an example of a linear function is a $1^{st}$ order polynomial. An example of a non-linear function may e.g. be a $2^{nd}$ or higher order polynomial. Another definition of a non-linear representation in conformity with that of the invention is that the line is curved.

According to an embodiment of the invention, said mathematical model varies over time.

According to an embodiment of the invention, a mathematical model may on a run-time basis be applied for approximation to a function or e.g. a number of discrete points such as PCM samples. An example of such approximations may be a polynomial approximation to a number of signal samples and where a new approximation is recalculated/remodeled in certain intervals. Such an interval may e.g. comprise a period of a PWM amplifier or converter.

In other words, a model varying over time may e.g. comprise a model, which is recalculated in each period of a PWM reference signal.

According to an embodiment of the invention, at least one of said signal representations comprising a continuous representation of a discrete time domain signal (DTB).

According to a preferred embodiment of the invention, a model of a discrete signal is established for the purpose of interpolating or extrapolating a part of the discrete signal, which is not available due to the discrete nature of the signal.

Evidently, a continuous model may be established in different intervals or in different proportion compared to the discrete signal. One model may e.g. cover the complete discrete signal, i.e. applied for the purpose of recovering the complete "original" signal from which the discrete values originates. Another model may e.g. only cover certain intervals or parts of the "original" signal, i.e. periods of the signal needed for certain purposes. Such model may e.g. be chosen to cover only parts of a PWN input discrete signal, namely the parts of those where the input discrete signal intersect the reference signal.

According to an embodiment of the invention, said method comprising the step of establishing a time varying continuous representation of a discrete time domain signal (DTB) on a real-time basis.

According to an embodiment of the invention, the model is established on a real-time basis. An example of such real-time application may be in a converter, e.g. a D/A-converter, where a real-time operation is needed.

According to an embodiment of the invention, said continuous representation comprising a model of the signal curve fitted to the discrete time domain signals (DTB).

According to an advantageous embodiment of the invention, the model is established in intervals for the purpose of obtaining a continuous representation, which within a certain interval may be applied for the purpose of determining a cross point, also referred to as an intersection, although fictive, between the discrete signal and another signal.

According to an embodiment of the invention, said continuous representation comprising an interpolation polynomial.

According to a further embodiment of the invention, the continuous representation may comprise an extrapolated model.

According to an embodiment of the invention, said continuous representation comprising an interpolation of second or higher order polynomial of a non-linear signal.

According to a further embodiment of the invention, the polynomial may be of other order than just two. Third or higher order polynomial may be applied as well. In this context it should be noted that the invention advantageously facilitates the application of quite advanced signal models, which until now have been unrealistic. This is due to the fact that the computation needed for obtaining the desired intersection on the basis of such models by finding of roots is more or less impossible with, at the time being available computation resources. According to the invention, these values may simply be established by straightforward iterations based in the model itself without any need for complicated computation on the model.

According to an embodiment of the invention, said interpolation polynomial comprises a second order polynomial function.

According to experiments, advantageous interpolations and intersections have been obtained by applying second order polynomials.

According to a preferred embodiment of the invention, the reference may be regarded as a sought of symmetry function between the iteration model and the inverse function of the iteration model. When keeping the reference signal linear, i.e. non-curved, throughout each period of the reference signal in a one-to-one relationship, the desired intersection between the reference signal and the model of the signal may simply be obtained as a sequence of iterations based on the model $f(x)$ and inverse model $h(x)$, the iterations resulting in a convergence towards the intersection point.

In an embodiment of the invention, said mirror function comprises the inverse function of said continuous non-linear signal.

According to a preferred embodiment of the invention, the inverse function may simply be established as the inverse function of the non-linear signal if the reference signal in each period forms a symmetry function where the slope numerically is one (1). This embodiment is quite advantageous due to the fact that the mirror function then may be applied on the fly by simply shifting between X and Y coordinates in the iteration.

Moreover, the invention relates to a pulse width modulator comprising in input block for receipt of an input signal, a reference signal generator provided for establishment of a reference signal, an intersection computing block an output block establishing a pulse width modulated signal on the basis of a stream of intersections established by said intersection computing block, wherein estimation of a stream of intersections between the input signal and the reference signal is performed in said intersection computing block by iterative calls of a function representing the input signal.

Moreover, the invention relates to a pulse width modulator comprising in input block for receipt of an input signal, a reference signal generator provided for establishment of a reference signal, an intersection computing block an output block establishing a pulse width modulated signal on the basis of a stream of intersections established by said intersection computing block, wherein estimation of a stream of intersections between the input signal and the reference signal is performed in said intersection computing block by iterative calls of a function representing the reference signal.

Moreover, the invention relates to a pulse width modulator comprising in input block for receipt of an input audio signal, a reference signal generator provided for establishment of a reference signal, an intersection computing block an output block establishing a pulse width modulated signal on the basis of a stream of intersections established by said intersection computing block, wherein estimation of a stream of intersections between the input signal and the reference signal is performed in said intersection computing block according to any of the claims 1-34 and wherein one of the continuous signals represents an input signal of the pulse width modulator and wherein the other continuous signal represents a pulse width modulator reference signal.

In an embodiment of the invention at least one iterative call of a function describing the input signal.

In an embodiment of the invention at least one iterative call at least one iterative call of a function describing the reference signal.

THE FIGURES

The invention will now be described with reference to the drawings of which

FIG. 3a to 5b illustrate the iterations when applying the method according to an embodiment of the invention in three different relationships between the input signal and the reference signal.

Figure 7A:
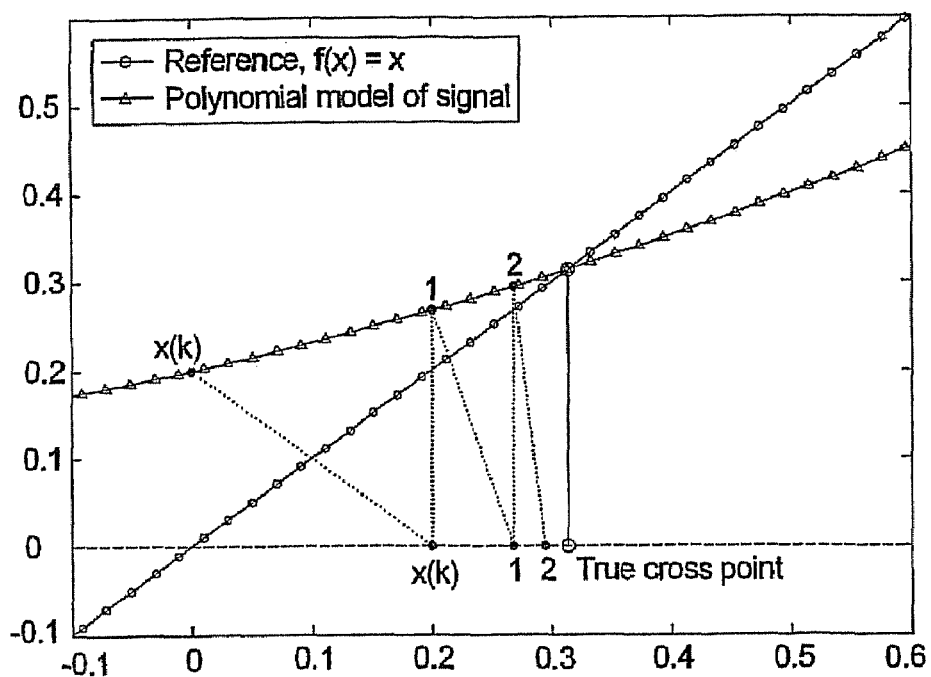
Figure 7B:
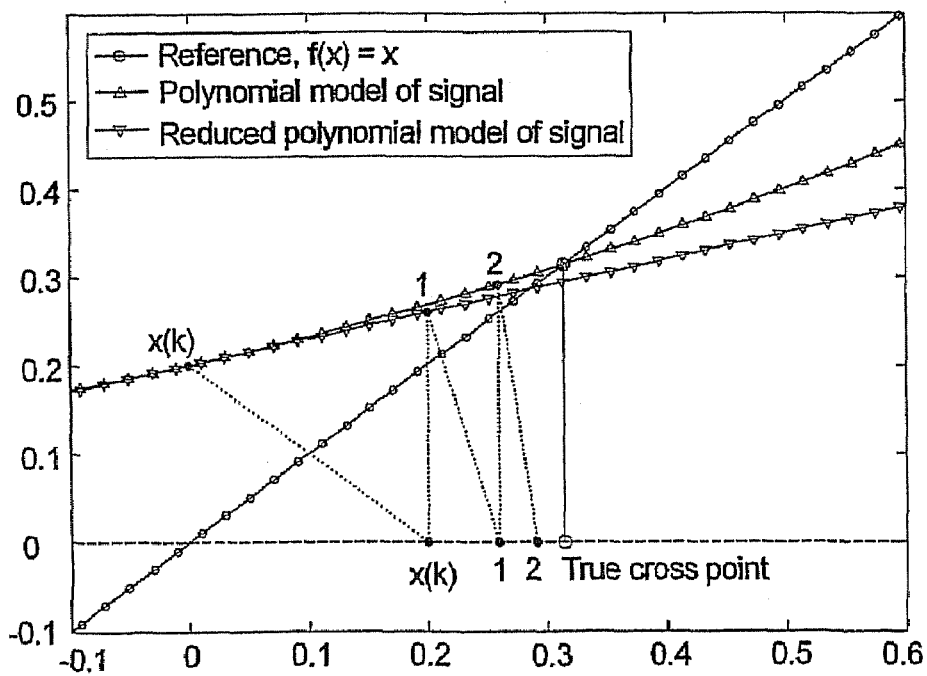
Figure 8:
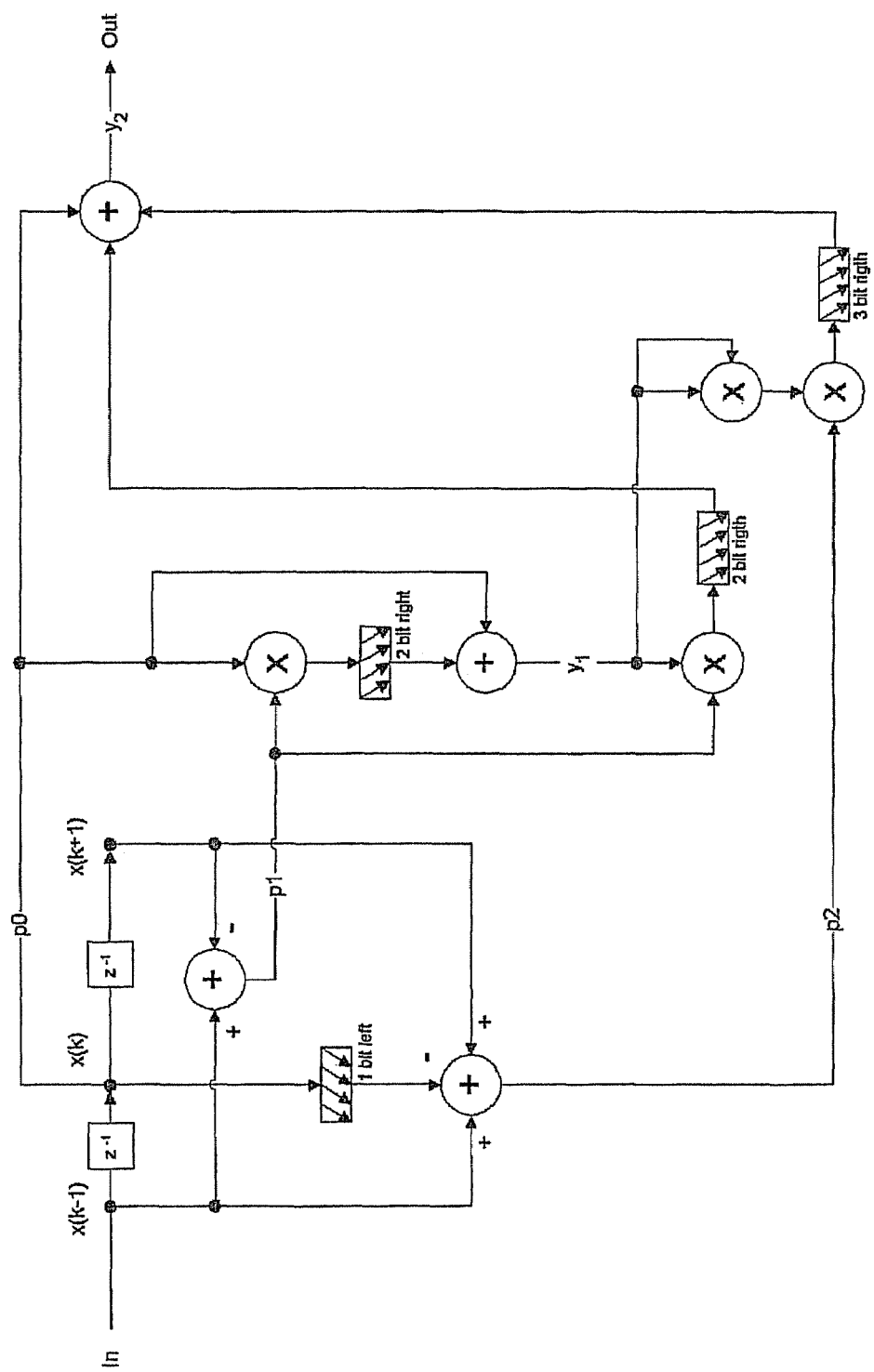
Figure 9:
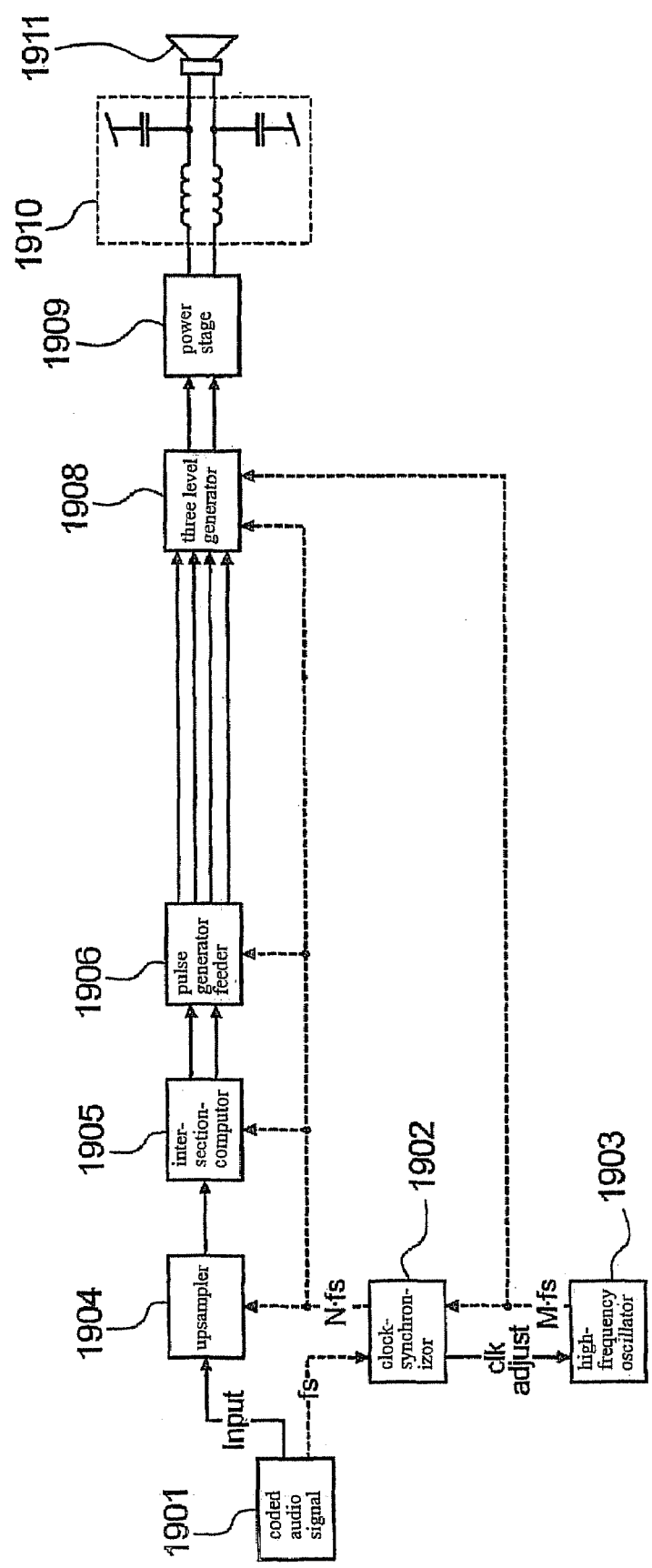

FIG. 6a illustrates the convergence of the iterations to an intersection estimate, FIGS. 6b-6c illustrate the convergence of the iterations to an intersection estimate, FIGS. 7a-7b illustrate two different iteration processes within the scope of the invention FIG. 8 illustrates a hardware implementation of one embodiment of the invention and FIG. 9 illustrates a block diagram of an embodiment of the invention.

DETAILED DESCRIPTION

Figure 1A:
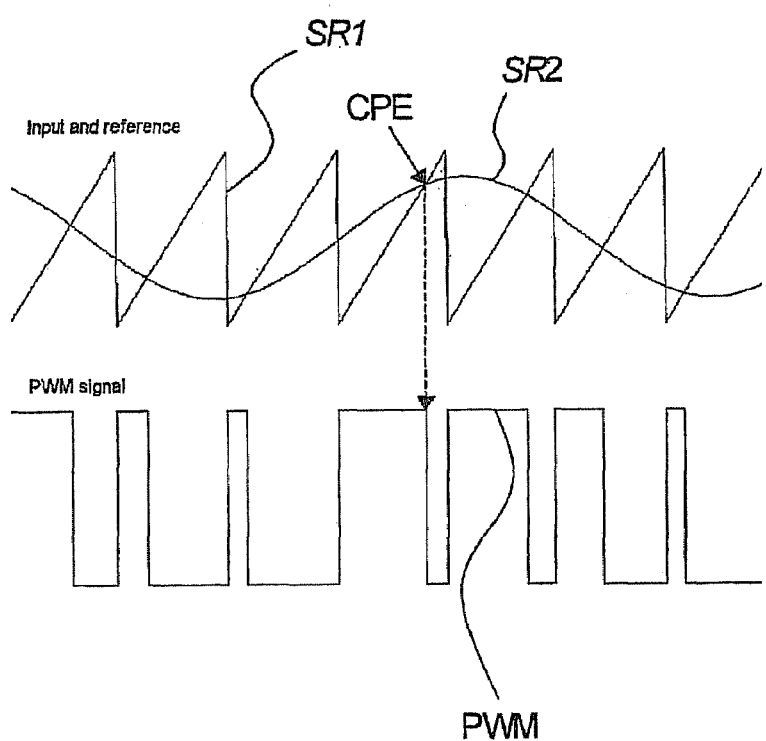
FIGS. 1a-1b illustrate the basic principle of PWM-modulation.
Figure 1B:
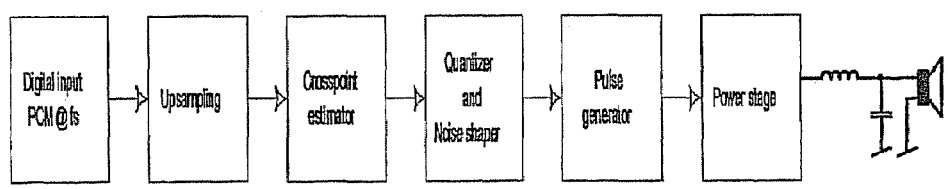

FIG. 1a and 1b illustrate the basic properties and the nature of PWM modulation.

It should be noted that the invention in general might be regarded as the establishment of an intersection estimate between at least two curves by means of computer calculations, where at least one of the curves is a non-linear function. One of several applications is within PWM (pulse width modulation) modulation, and the following explanation refers to an application within this technical field.

The two signal representative curves SR1 and SR2 represent a PWM reference signal and a PWM input signal, respectively.

In the time continuous domain a PWM signal, i.e. the signal of FIG. 1b is obtained by comparing the input signal representation with e.g. the output of a sawtooth generator. When the input signal is higher than the reference signal representation SR1, here a sawtooth, the PWM output is high and when the input signal is lower than the reference, the PWM output is low.

Such a switch point is illustrated in FIG. 1a as CPE.

Figure 2A:
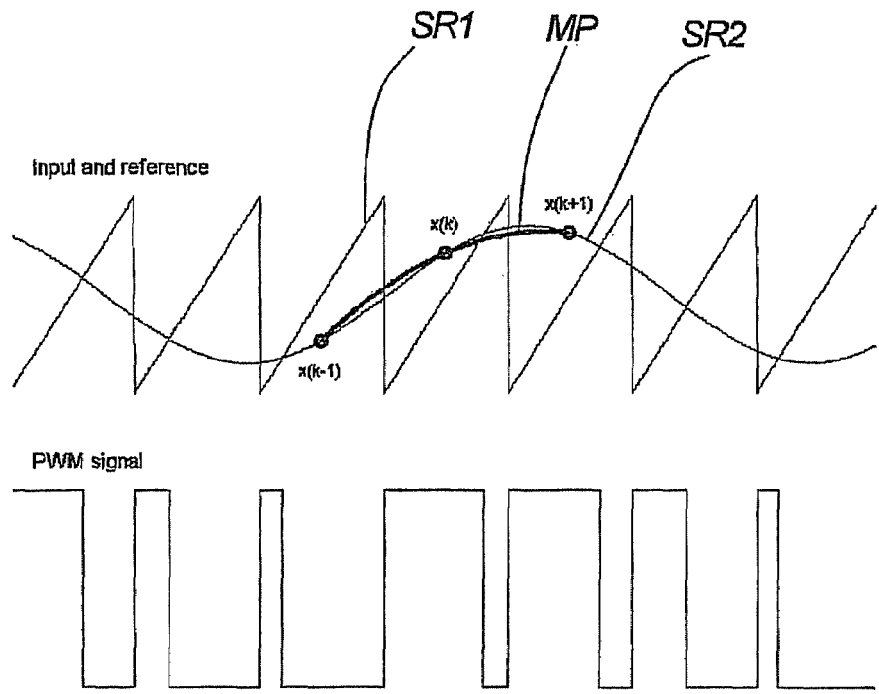
FIGS. 2a-2c illustrate the principles of dealing with discrete input signals.

In the discrete time domain, we only have the "true" signal values with a given interval, i.e. a sample rate. This is illustrated in FIG. 2a, where discrete points $x(k-1)$, $x(k)$ and $x(k+1)$ represent an input signal SR2.

Evidently, discrete samples may not, or at least in very few cases, actually define the intersection between the input signal SR2 formed by a sequence of samples and the continuous reference signal representation SR1.

Therefore, a model MP of the input signal SR2 must be made in order to establish an estimate of the cross points between input SR2 and the reference SR1. An example of such a model, which is a simple and cost effective model, may be a $2^{nd}$ order polynomial, which can be fitted to for instance three input samples, illustrated in FIG. 2a by the mathematical model MP. Evidently, in intervals, a new model should be found in order to ensure that a mathematical model is available at any intersection between the input signal SR2 and the reference signal SR1.

In practice in a PWM application, one model MP should typically be established in each PWM period.

Figure 2B:
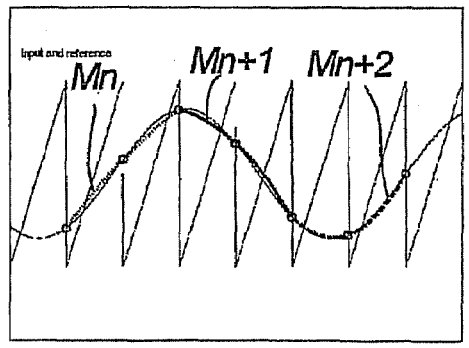

FIG. 2b illustrates an example of several applicable ways of establishing a model on a run-time basis. According to the illustrated interval on FIG. 2b, three models Mn, Mn+1, Mn+2 have been established. Each of the illustrated models Mn, Mn+1, Mn+2 is established on the basis of a three point $2^{nd}$ order polynomial approximation. In other words, the three models Mn, Mn+1, Mn+2 establish a combined curve.

It is noted that the applied models may be more or less advanced, and the combined curve may be established in both a non-overlapping manner (as illustrated) and an overlapping manner. Higher order polynomials may also be applied.

According to this embodiment of the invention, a model is recalculated in every second PWM period.

Figure 2C:
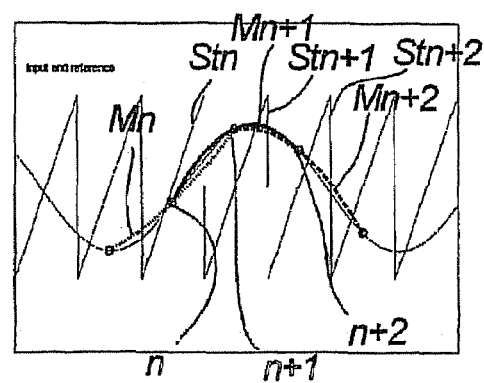

FIG. 2c illustrates a further embodiment of the invention where the models are established in an overlapping mode Mn, Mn+1, Mn+2. When applying overlapping models, a clear strategy of how to obtain the intersection with the reference should be established. One applicable method may for instance be to establish the intersection between the model Mn and the sawtooth signal Stn, i.e. between Mn+1 and the sawtooth signal Stn+1, between Mn+2 and the sawtooth signal Stn+2, etc.

Note that the signal and axis are only illustrative to the basics of PWM.

The illustrated model MP of FIG. 2a can be found:

$$T \cdot p = x \Leftrightarrow \begin{vmatrix} t(k-1)^0 & t(k-1)^1 & t(k-1)^2 \\ t(k)^0 & t(k)^1 & t(k)^2 \\ t(k+1)^0 & t(k+1)^1 & t(k+1)^2 \end{vmatrix} \cdot \begin{vmatrix} p_0 \\ p_1 \\ p_2 \end{vmatrix} = \begin{vmatrix} x(k-1) \\ x(k) \\ x(k+1) \end{vmatrix}$$

If the time axis range in a single PWM period is chosen to go from −1.0 to +1.0, we get −2, 0 and 2 for t(k−1), t(k) and t(k+1) respectively. With these t-values we get the following matrix equation:

$$\begin{vmatrix} 1 & -2 & 4 \\ 1 & 0 & 0 \\ 1 & 2 & 4 \end{vmatrix} \cdot \begin{vmatrix} p_0 \\ p_1 \\ p_2 \end{vmatrix} = \begin{vmatrix} x(k-1) \\ x(k) \\ x(k+1) \end{vmatrix} \Leftrightarrow \begin{vmatrix} p_0 \\ p_1 \\ p_2 \end{vmatrix}$$

$$= \begin{vmatrix} 1 & -2 & 4 \\ 1 & 0 & 0 \\ 1 & 2 & 4 \end{vmatrix}^{-1} \cdot \begin{vmatrix} x(k-1) \\ x(k) \\ x(k+1) \end{vmatrix}$$

$$= \begin{vmatrix} 0 & 1 & 0 \\ -\frac{1}{4} & 0 & \frac{1}{4} \\ \frac{1}{8} & -\frac{1}{4} & \frac{1}{8} \end{vmatrix} \cdot \begin{vmatrix} x(k-1) \\ x(k) \\ x(k+1) \end{vmatrix}$$

In other words, $$p_0 = x(k)$$

$$p_1 = \frac{x(k+1) - x(k-1)}{4}$$

$$p_2 = \frac{x(k+1) - 2 \cdot x(k) + x(k-1)}{8}$$

So the coefficients for the second order polynomial describing the continuous domain signal can be found using shift and add operations.

In order to establish the desired intersection a conventional way of finding the roots in the polynomial would of course be to use the analytical solution:

$$x_{cross} = \frac{-b \pm \sqrt{b^2 - 4 \cdot a \cdot c}}{2 \cdot a} = \frac{-(p_1 - 1) \pm \sqrt{(p_1 - 1)^2 - 4 \cdot p_0 \cdot p_2}}{2 \cdot p_0}$$

But the square root and division do not seem like attractive solutions. Consequently, prior art solutions focus on somewhat less complicated algorithms, involving reduced complexity mathematical models.

According to the invention, another approach to the intersection estimation is applied.

Supposing that the input signal SR2 is highly over sampled and band limited, which ensures that the slew rate (gradient) of the signal always is lower than the reference. And there is only one single cross point in one PWM period.

A nice feature of many mathematically functions, including a polynomial of second order, is that, when called recursively, they approach the point of the function, where the function input equals the function output if the first derivative of the function at this point is less than one. And this point equals the point where the function crosses the sawtooth SR1, f(x)=x, i.e. the sought intersection.

FIGS. 3a, 3b, FIGS. 4a, 4b and FIGS. 5a and 5b illustrate three examples of iterative findings of intersection estimates according to embodiments of the invention. The estimate of the intersection is found using the scheme listed below, i.e. an iterative call of the mathematical model.

```
x = start guess;
for(k=0; k<N_ITER; k++)
{
    x = f(x);
}
```

The mathematically function in these examples are a sinusoidal.

In FIGS. 3a and 3b, illustrating an iterative estimation according to an embodiment of the invention, the signal bandwidth of reference signal SR1 is five times the bandwidth of input signal SR2.

The y-axis of FIG. 3a represents the function value of the reference and input signal representations and FIG. 3b illustrates the absolute error in dB of the estimated intersection as a function of the number of iterations.

When investigating the obtained result it is noted that the iterative method according to the invention may even be applied when the reference signal is relatively comparable to the input signal, of course depending on the application in which the method is applied.

According to the illustrated embodiment of the invention, each iteration improves the intersection estimate with approximately 6 dB.

Note that the improvements obtained during each iteration are substantially independent of the quality of the start guess, i.e. the initial iteration value upon which the iteration is based.

Figures 4A, 4B:
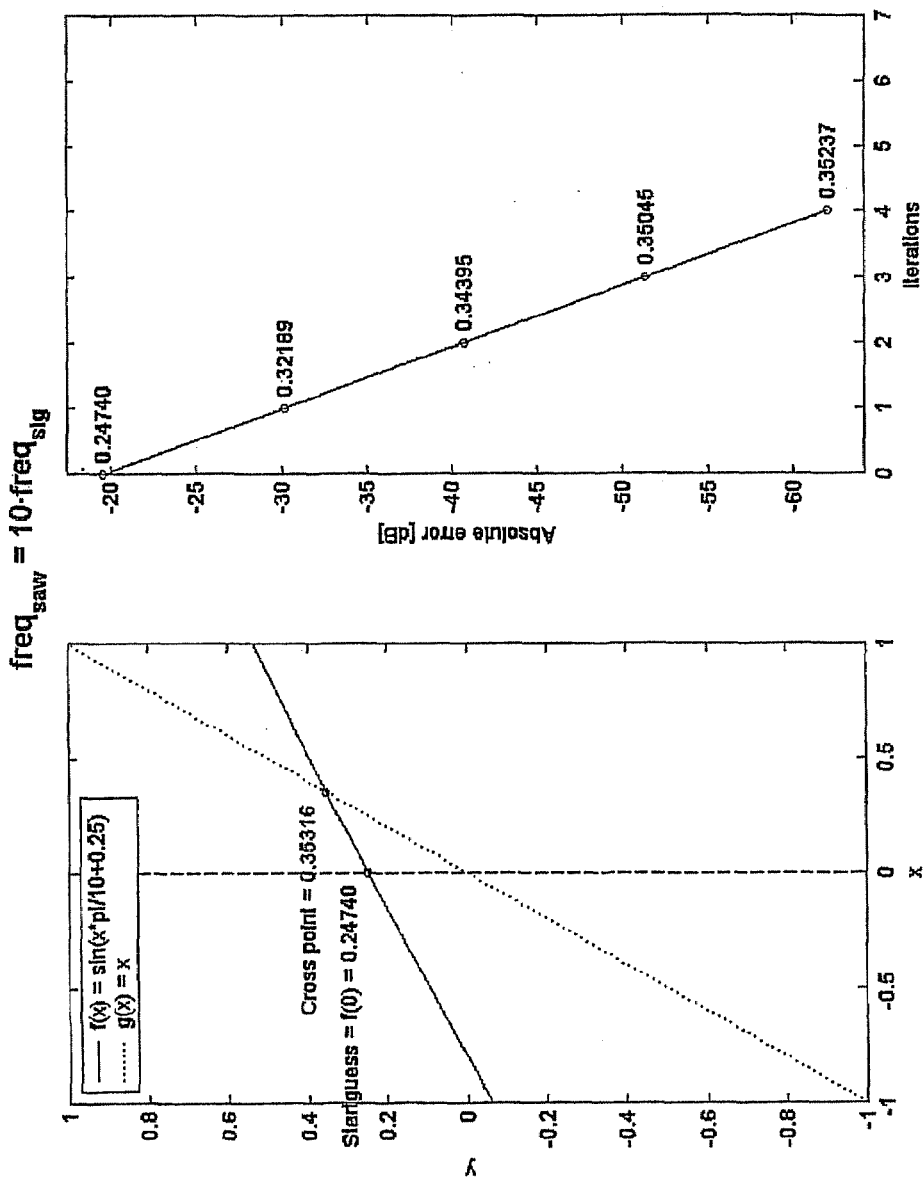

In FIGS. 4a and 4b, illustrating a further iterative estimation according to an embodiment of the invention, the signal bandwidth of reference signal SR1 is ten times the bandwidth of input signal SR2.

The y-axis of FIG. 4a represents the function value of the reference and input signal representations and FIG. 4b illustrates the absolute error in dB of the estimated intersection as a function of the number of iterations.

According to the illustrated embodiment of the invention, each iteration improves the intersection estimate with approximately 12 dB.

Figures 5A, 5B:
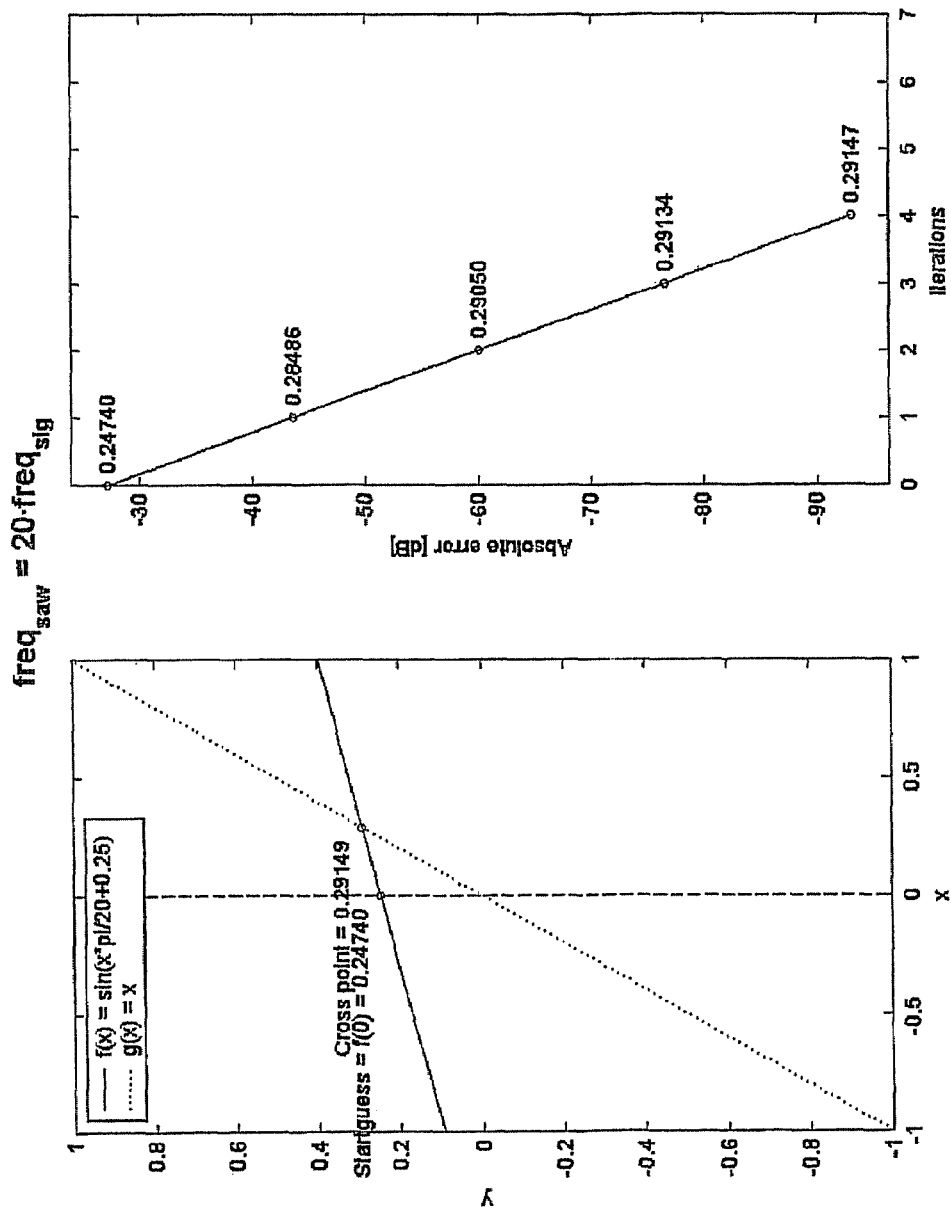

In FIGS. 5a and 5b, illustrating a first iterative estimation according to an embodiment of the invention, the signal bandwidth of reference signal SR1 is twenty times the bandwidth of input signal SR2. This corresponds approximately to a 20 kHz input signal full scale and a PWM rate, i.e. SR1, on 400 kHz.

The y-axis of FIG. 5a represents the function value of the reference and input signal representations and FIG. 5b illustrates the absolute error in dB of the estimated intersection as a function of the number of iterations.

According to the illustrated embodiment of the invention, each iteration improves the intersection estimate with approximately 18 dB.

In the above, the X-axis represents a normalized time axis and the y-axis represents a normalized Y-axis FIGS. 3a, 4a and 5a s illustrate the consecutive samples whereas FIGS. 3b, 4a and 5b illustrate the resulting error on the intersection estimate during the performed iterations.

As seen on the two figures above, the most accurate results, using a given number of iterations, are obtained when the slew rate (i.e. the gradient) of the input signal is low compared to the slew rate of the reference signal.

FIG. 6a illustrates a way of validating the method according to which it must be ensured that the cross point estimate,—also referred to as intersection, gets closer to the true cross point (xt) after each single iteration.

In other words, the function output value must be closer to the true cross point than the function input value. This is the case when ymin<f(xe)<ymax.

ymin=xe=lower convergence limit
ymax=2·xt−xe=upper convergence limit $$xt = f(xe) + \int_{xe}^{xt} f'(x)dx \text{ where } f'(x) = \frac{df(x)}{dx}$$

$$\Updownarrow$$

$$f(xe) = xt - \int_{xe}^{xt} f'(x)dx$$

and since −1<f'(x)<1 we get:

xe=ymin<f(xe)<ymax=2·xt−xe, thereby validating that an intersection may actually be found.

As mentioned above, the intersection point will typically not be located as a cross-point between the "true" continuous input signal and the reference, e.g. a sawtooth reference, but it will be estimated as the crossing between a mathematical model, e.g. a polynomial model, and the reference.

So we face two different kinds of errors in the intersection estimation:

The polynomial model (second order) is not perfect

We have to choose a finite number of iterations to locate the intersection

Experiments has, however, shown that the desired performance can be reached using only two iterations, when the PWM frequency is approximately 20 times the signal bandwidth in a PWM amplifier application. Evidently, such a result is impressing in particular when applied in the context of mathematical models of non-linear functions, which until now have been extremely complex to deal with.

Evidently, other numbers of iterations than two may be applied for other purposes and other iteration termination criteria may be applied according to the invention.

FIGS. 6b and 6c illustrates a more conceptual understanding of an embodiment of the invention. The X-axis represents a normalized time axis and the y-axis represents a normalized Y axis.

In FIG. 6b the function f(x) represents a given model of an input signal. The function has an inverse representation, h(x) (here=f$^{-1}$(x)) in the sense that it is symmetrical with respect to a symmetry function g(x). There is only one intersection between the function and the inverse function. This point is the intersection point. Typically and preferably, the symmetry axis formed by the symmetry function g(x) is in practice formed by e.g. a reference sawtooth having a slope which equals one. Other examples may e.g. be triangular waveform This means in practice that a first start guess SG will result in a first output value of f(x), OV1. This value will, when applied as an argument to the model f(x) in fact correspond to providing the inverse function f$^{-1}$(x), which again provides an output value OV2 and so forth up to OV5 will in this case correspond to the desired intersection estimate. It is clear from the illustration that further iterations will improve the quality of the intersection estimate itself. In practice, when applying a 2$^{nd}$ or polynomial order model f(x) of an input signal, only two iterations will provide a quite impressing intersection estimate, here: OV2.

Note that the inverse function is simply obtained by applying the output of each iteration step as the input to the next iteration on the same function, here f(x). In other words, in this illustrated embodiment there will be no need to establish an inverse function of f(x).

In FIG. 6c a further feature of the invention is illustrated. In this embodiment the curved representation f(x) is compared with a curved representation g(x). In this quite advanced embodiment, the intersection estimate may be established by establishing an mirror function h(x) of f(x) on the basis of g(x), i.e. where g(x) forms the symmetry function between h(x) and f(x). In this case, a curved reference signal may in fact be applied and an intersection estimate may still be obtained by few iterations by switching between the model f(x) and the inverse version of it, namely h(x).

An alternative approach than the illustrated of FIGS. 6b and 6c is, when facing a curved symmetry function g(x), to transform f(x) into a function f'(x) through g$^{-1}$(x). Perform the desired iterations in the "linear domain" corresponding to the illustrated iteration of FIG. 6b and the transform the obtained intersection back into the original domain, here corresponding to FIG. 6c. In this way, complex computation for the purpose of finding the mirror function may be avoided.

FIG. 7a and FIG. 7b illustrate two examples of many applicable iteration processes within the scope of the invention.

In both embodiments, the reference function is a sawtooth signal, where f(x)=x in each period.

The iteration process illustrated in FIG. 6a comprises two iterations:

$y_0$=x(k)=start guess $y_1$=$p_0$+$p_1$·$y_0$+$p_2$·$y_0$·$y_0$ $y_2$=$p_0$+$p_1$·$y_1$+$p_2$·$y_1$·$y_1$ That sums up to six multiplications and four additions.

A simplified iteration process as illustrated in FIG. 7b also comprises two iterations. However, in order to reduce the computer power (silicon) needs, the first of the two iterations can be simplified simply by throwing the "square part" away:

$y_0$=x(k)=start guess $y_1$=$p_0$+$p_1$·$y_0$ $y_2$=$p_0$+$p_1$·$y_1$+$p_2$$y_1$·$y_1$ Now we only need 4 multiplications and 3 additions.

A very interesting observation is that the 3$^{rd}$ harmonic, which is the most annoying error component in audio applications, of the sparse solver output has a lower level than the true solver output. Again, it should be noted that this suppression of undesired 3$^{rd}$ order harmonic distortion is obtained while at the same time reducing the computations.

Turning now to a hardware application, the polynomial coefficients may be calculated as:

$p_0$=x(k)

$p_1$=(x(k+1)−x(k−1))·0.25

$p_2$=(x(k−1)−2·x(k)+x(k+1))·0.125

Since the input signal has a low bandwidth, e.g. approximately 20 kHz compared to the applied sample rate, e.g. 384 kHz, the $p_1$ and $p_2$ values will have low amplitude.

So to optimize the dynamic range of these values, the coefficients are scaled up and corrected later in the two iterations, like below:

$$p_0 = x(k)$$

$$p_1 = x(k+1) - x(k-1)$$

$$p_0 = x(k+1) - 2 \cdot x(k) + x(k-1)$$

$$y_0 = x(k) = p_0 = \text{start guess}$$

$$y_1 = p_0 + p_1 \cdot y_0 \cdot 0.25$$

$$y_2 = p_0 + p_1 \cdot y_1 0.25 + p_2 \cdot y_1 \cdot y_1 \cdot 0.125$$

FIG. 8 illustrates an example of an implementation diagram of the above listed algorithm. The illustrated hardware structure at a given time initially establishes the model coefficients, $p_0$, $p_1$ and $p_2$, reading from left to right. Thereafter two iterations are performed and Out represents the final output value.

Numerous other structures or hardware may be applied within the scope of the invention.

The illustrated algorithm may e.g. be implemented in a conventional DSP, FPGA, ASIC, PLD, CPLD or any other suitable signal processing structure.

In the following example the performance of the method according to an embodiment of the invention, when the input signal is 6.66 KHz, 90% full scale and where the PWM, e.g. SR1 is over sampled by eight times, i.e. 384 KHz.

According to the below examples, the sawtooth is single-sided and the PWM signal is a two-level signal. The fourth example, algorithm A, represents the above described embodiment of the invention compared to the algorithms A to C representing algorithms well known within the art.

| | THD | $2^{nd}$ | $3^{rd}$ | Mult | Add | Shft | Comp | Abs |
|---|---|---|---|---|---|---|---|---|
| A | −88 dB | −90 dB | −117 dB | 7 | 9 | 0 | 0 | 0 |
| B | −113 dB | −115 dB | −133 dB | 14 | 11 | 0 | 1 | 0 |
| C | −84 dB | −92 dB | −87 dB | 6 | 6 | 0 | 0 | 1 |
| D | −85 dB | −87 dB | −124 dB | 4 | 6 | 4 | 0 | 0 |

THD refers to the total harmonic distortion. In this case, with an input signal of 6.66 kHz, the total error comprises the $2^{nd}$ and $3^{rd}$ order errors, represented in the second and third column.

However, when comparing the efficiency of the above-applied methods it is noted that the method applied according to an embodiment of the invention features a relatively impressing performance on the basis of very few calculations. In particular it is noted that the harmonic distortion originating from the $3^{rd}$ order harmonic is −124 dB compared to the result obtained according to algorithm B of −133 dB, where the result according to the invention is obtained by, compared to algorithm B, very few calculations.

This is quite significant when applying the invention in audio applications due to the fact that $3^{rd}$ order harmonics represent the most undesired distortion. This is due to the fact that odd-order harmonic distortion has been recognized far more annoying to the human ear than even-order harmonics.

In other words, according to the invention, an advantageous method of establishing an intersection between two signal representations, where at least one of the representations may be curved, due to the fact that the method may be performed with very little computing and, e.g. in audio applications, with very impressing results.

In this context is should be noted that the algorithm according to the invention may be performed in a hardware implementation in e.g. FPGA, ASIC, PLD, CPLD, where relevant mathematical operations other than multiplication and addition may be performed "free of charge".

Finally, it should be emphasized that the invention is in particular advantageous when applied in e.g. FPGA, ASIC, PLD, CPLD due to the fact that additions may be performed with relatively little computational effort in the computer.

One of several applications in which the above-described method may e.g. be applied according to a preferred embodiment of the invention is in a PWM amplifier comprising digital input, e.g. for high resolution audio, e.g. 24 bit, at a sample rate of e.g. 44.1 kHz or 48 kHz.

The digital input is then delivered to an upsampling asynchronous or synchronous sample rate converter, upsampling the input signal to the same rate as the PWM switch frequency, e.g. 384 kHz (=8×48 kHz).

The upsampled signal may then be compared to a reference signal according to the above described methods and the edges of a PWM signal may be determined. The established edges may then quantized and noise shaped to pulse widths having a somewhat lover resolution. The noise shaping ensures that the quantization error is suppressed within the audio band.

Subsequently, a pulse generator establishes the calculated switch times to a physical signal, e.g. via a power stage such as a FET push-pull stage, i.e. a current amplifier.

Finally, the application may involve a demodulation filter and a loudspeaker.

FIG. 9 illustrates an example of an application of the present invention. The illustrated system comprises a PWM amplifier/audio system.

The system comprises an input block 1901 adapted for receipt of a coded audio signal. The input block 1901 branches the input signal into two principle different directions; in one direction for the purpose of converting the information coded in the input signal into a relevant PWM representation and one direction for the purpose of establishing a clock reference signal on the basis of the input signal.

The latter direction is represented by a PLL clock-synchronizing block 1902 referring to a high-frequency oscillator block 1903.

The first principle direction starts with the upsampling block 1904 basically transforming the input signal from one sampling frequency representation into an N times higher sampling representation.

The upsampled signal is then fed to an intersection-computing block 1905 adapted for determination of intersections with a parallel reference signal representation according to an embodiment of the invention. The intersections may e.g. be established in the block 1905 according to the principles of FIGS. 7A and 7B. The consecutive noise shaping and quantizing block 1906 feeds the established intersections a PWM pulse generator, in this case a true differential three level generator 1908 referring to the high frequency generator 1903.

The resulting PWM signal is then fed to a power stage 1909 and from there via a demodulator 1910 to a loudspeaker 1911.

Evidently, the above-mentioned application only describes one of several applications within the scope of the invention.

An example of an application in which the present invention may be applied is disclosed in PCT DK03/00475, hereby incorporated by reference.

A further example in which the invention may advantageously be applied is EP 1178388 A1, hereby incorporated by reference.

The invention claimed is:

1. Method of estimating an intersection between at least two continuous signal representations (SR1, SR2) in a pulse width modulator, at least one of said continuous signal representations (SR1, SR2) being non-linear, said method comprising the step of providing an intersection estimate (CPE) between said at least two continuous signal representations on the basis of at least one iteration comprising at least one iterative call of a function describing said continuous signal representations (SR1, SR2) being non-linear and whereby said estimating of intersections are performed in a pulse width modulation modulator.

2. Method of estimating an intersection between at least two continuous signal representations according to claim 1, whereby a stream of said intersection estimates determine a pulse width modulated (PWM) output signal of the pulse width modulator.

3. Method of estimating an intersection between at least two continuous signal representations according to claim 1, whereby said intersections determine a rising or a falling edge of a pulse width modulated (PWM) output signal of the pulse width modulator.

4. Method of estimating an intersection between at least two continuous signal representations according to any of the claim 1, at least one of said signal representations comprising a continuous representation of a discrete time domain signal (DTB).

5. Method of estimating an intersection between at least two continuous signal representations according to claim 4, whereby said discrete time domain signal (DTB) comprises an input signal of a pulse width modulator and where the other of said at least two continuous signal representations (SR1, SR2) comprising a reference signal on the basis of which a pulse width modulation of said input signal is established.

6. Method of estimating an intersection between at least two continuous signal representations according to claim 5, said reference signal comprising a periodically function, preferably a sawtooth, a triangular or a curved waveform.

7. Method of estimating an intersection between at least two continuous signal representations according to claim 5, whereby said reference signal comprises a periodical signal and where an absolute value of a gradient is constant in each period.

8. Method of estimating an intersection between at least two continuous signal representations according to claim 1, whereby a mirror function comprises an inverse function of said continuous non-linear signal.

9. Method of estimating an intersection between at least two continuous signal representations according to claim 1, whereby said at least one iterative call comprises at least one evaluation of output of said continuous non-linear signal representation when applying an input value (IV).

10. Method of estimating an intersection between at least two continuous signal representations according to claim 1, whereby said at least one iterative call comprises at least one evaluation of the output of a mirror function of said continuous non-linear signal representation when applying an input value (IV), said mirror function being established by mirroring of said continuous non-linear signal representation function in a symmetry function.

11. Method of estimating an intersection between at least two continuous signal representations according to claim 10, where said input value comprises a start guess (SG).

12. Method of estimating an intersection between at least two continuous signal representations according to claim 10, where said input value comprises an output value of a previous iteration.

13. Method of estimating an intersection between at least two continuous signal representations according to claim 10, whereby said at least two continuous signal representations (SR1, SR2) comprises a non-linear representation of an input signal and a periodic reference signal and where said reference signal forms the symmetry function between said non-linear representation of an input signal and said mirror function.

14. Method of estimating an intersection between at least two continuous signal representations according to claim 13, whereby said symmetry function is linear.

15. Method of estimating an intersection between at least two continuous signal representations according to claim 1, whereby a gradient of the at least one of said continuous signal representations (SR1, SR2) being non-linear is smaller than the other continuous signal representation.

16. Method of estimating an intersection between at least two continuous signal representations according to claim 1, whereby a gradient of the at least one of said continuous signal representations (SR1, SR2) being non-linear is at least three times smaller, preferably five times smaller than the other continuous signal representation.

17. Method of estimating an intersection between at least two continuous signal representations according to claim 1, a signal bandwidth of said non-linear signal representation being more than ten (10) times smaller a signal bandwidth of the signal representation with which it is compared.

18. Method of estimating an intersection between at least two continuous signal representations according to claim 1, a signal bandwidth of said non-linear signal representation being more than twenty (20) times smaller a signal bandwidth of the signal representation with which it is compared.

19. Method of estimating an intersection between at least two continuous signal representations according to claim 1, whereby said iteration comprises a recursive call of said continuous signal representation or a derivative thereof.

20. Method of estimating an intersection between at least two continuous signal representations according to claim 19, whereby said iterative call initiates an iteration sequence.

21. Method of estimating an intersection between at least two continuous signal representations according to claim 20, whereby said iteration sequence comprises at least a first iteration group and where said first iteration group is performed on a simplified mathematical model.

22. Method of estimating an intersection between at least two continuous signal representations according to claim 21, whereby said iteration sequence further comprises at least one further iteration group and where said further iteration is performed on a more complex mathematical model.

23. Method of estimating an intersection between at least two continuous signal representations according to claim 1, whereby at least one of said iterative calls is established by means of a polynomial model comprising $2^{nd}$ or higher orders components, where at least one of the high-order component has been omitted.

24. Method of estimating an intersection between at least two continuous signal representations according to claim 1, whereby said at least one iterative call is established by applying a previous value of said continuous signal representations representing a non-linear signal or a value of the non-linear signal as argument.

25. Method of estimating an intersection between at least two continuous signal representations according to claim 1, whereby the argument of at least one iterative calls comprises an output of previous calls of the continuous signal representation of a non-linear signal.

26. Method of estimating an intersection between at least two continuous signal representations according to claim 1, whereby said at least one iteration comprises a predetermined fixed number of iterative recursive calls of the continuous representation.

27. Method of estimating an intersection between at least two continuous signal representations according to claim 26, whereby said fixed number of iterations is less than 20 (twenty), preferably less than 10 (ten), even more preferably less than 5 (five).

28. Method of estimating an intersection between at least two continuous signal representations according to claim 1, whereby said at least one of said continuous signal representations (SR1, SR2) being non-linear is represented by at least one mathematical model (MP).

29. Method of estimating an intersection between at least two continuous signal representations according to claim 28, whereby said mathematical model varies over time.

30. Method of estimating an intersection between at least two continuous signal representations according to claim 1, said method comprising the step of establishing a time varying continuous representation of a discrete time domain signal (DTB) on a real-time basis.

31. Method of estimating an intersection between at least two continuous signal representations according to claim 30, said continuous representation comprising a model of the signal curve fitted to the discrete time domain signals (DTB).

32. Method of estimating an intersection between at least two continuous signal representations according to claim 30, said continuous representation comprising an interpolation polynomial.

33. Method of estimating an intersection between at least two continuous signal representations according to claim 30, said continuous representation comprising an interpolation of second or higher order polynomial of a non-linear signal.

34. Method of estimating an intersection between at least two continuous signal representations according to claim 32, whereby said interpolation polynomial comprises a second order polynomial function.

35. Hardware structure comprising means for performing the method according to claim 1.

36. Hardware structure according to claim 35, wherein said hardware structure comprises DSP, FPGA, ASIC, PLD, CPLD or any other suitable signal processing structure.

37. Programming code for establishing the method according to claim 1 in a hardware structure.

38. Data carrier comprising the programming code of claim 37.

39. Pulse width modulator comprising
in input block for receipt of an input signal,
a reference signal generator provided for establishment of a reference signal,
an intersection computing block
an output block establishing a pulse width modulated signal on the basis of a stream of intersections established by said intersection computing block,
wherein estimation of a stream of intersections between the input signal and the reference signal is performed in said intersection computing block by iterative calls of a function representing the input signal.

40. Pulse width modulator comprising
in input block for receipt of an input signal,
a reference signal generator provided for establishment of a reference signal,
an intersection computing block
an output block establishing a pulse width modulated signal on the basis of a stream of intersections established by said intersection computing block,
wherein estimation of a stream of intersections between the input signal and the reference signal is performed in said intersection computing block by iterative calls of a function representing the reference signal.

41. Pulse width modulator comprising
in input block for receipt of an input audio signal,
a reference signal generator provided for establishment of a reference signal,
an intersection computing block
an output block establishing a pulse width modulated signal on the basis of a stream of intersections established by said intersection computing block,
wherein estimation of a stream of intersections between the input signal and the reference signal is performed in said intersection computing block according to claim 1 and wherein one of the continuous signals represents an input signal of the pulse width modulator and wherein the other continuous signal represents a pulse width modulator reference signal.

42. Pulse width modulator according to claim 41, wherein said at least one iterative call is a call of a function describing the input signal.

43. Pulse width modulator according to claim 41, wherein said at least one iterative call is a call of a function describing the reference signal.

* * * * *